(12) United States Patent
Sawaguchi et al.

(10) Patent No.: US 10,759,151 B2
(45) Date of Patent: Sep. 1, 2020

(54) THERMAL CONDUCTIVE INSULATING SHEET, METHOD FOR PRODUCING SAME, AND INTERMEDIATE LAMINATE

(71) Applicant: TOYO INK SC HOLDINGS CO., LTD., Tokyo (JP)

(72) Inventors: Toshiichi Sawaguchi, Tokyo (JP); Gaku Kashiwamura, Tokyo (JP); Go Miyazawa, Tokyo (JP)

(73) Assignee: TOYO INK SC HOLDINGS CO., LTD., Tokyo (JP)

( * ) Notice: Subject to any disclaimer, the term of this patent is extended or adjusted under 35 U.S.C. 154(b) by 40 days.

(21) Appl. No.: 16/082,544

(22) PCT Filed: Mar. 8, 2017

(86) PCT No.: PCT/JP2017/009183
§ 371 (c)(1),
(2) Date: Sep. 6, 2018

(87) PCT Pub. No.: WO2017/154962
PCT Pub. Date: Sep. 14, 2017

(65) Prior Publication Data
US 2019/0077133 A1    Mar. 14, 2019

(30) Foreign Application Priority Data

Mar. 9, 2016 (JP) .................. 2016-045514
Nov. 29, 2016 (JP) .................. 2016-230822

(51) Int. Cl.
| | | |
|---|---|---|
| *B32B 27/20* | (2006.01) | |
| *C01B 21/064* | (2006.01) | |
| *H01L 23/373* | (2006.01) | |
| *H05K 7/20* | (2006.01) | |
| *H01L 23/36* | (2006.01) | |
| *B32B 27/18* | (2006.01) | |
| *B32B 27/36* | (2006.01) | |

(52) U.S. Cl.
CPC .......... *B32B 27/20* (2013.01); *B32B 27/18* (2013.01); *C01B 21/064* (2013.01); *H01L 23/36* (2013.01); *H01L 23/373* (2013.01); *H05K 7/20* (2013.01); *B32B 27/36* (2013.01)

(58) Field of Classification Search
CPC .......... B32B 2250/05; B32B 2250/42; B32B 2264/10; B32B 2307/302; B32B 2457/00; B32B 27/08; B32B 27/18; B32B 27/20; B32B 27/36; B32B 7/02; C01B 21/064; C01B 21/072; C01P 2004/32; C08K 2003/2227; C08K 2003/282; C08K 2003/385; C08K 2201/005; C08K 3/22; C08K 3/28; C08K 3/38; C09K 5/14; H01L 23/36; H01L 23/373; H01L 23/3731; H01L 23/3736; H01L 23/42; H05K 7/20

See application file for complete search history.

(56) References Cited

U.S. PATENT DOCUMENTS

| | | |
|---|---|---|
| 2011/0259566 A1 | 10/2011 | Izutani et al. |
| 2013/0189514 A1 | 7/2013 | Nishiyama |
| 2014/0079913 A1 | 3/2014 | Nishiyama |
| 2016/0009947 A1 | 1/2016 | Sugiyama et al. |

FOREIGN PATENT DOCUMENTS

| | | |
|---|---|---|
| JP | 2010157563 | 7/2010 |
| JP | 2013039834 | 2/2013 |
| JP | 2013229534 | 11/2013 |
| JP | 2015034269 | 2/2015 |
| WO | 2012046814 | 4/2012 |
| WO | 2015178416 | 11/2015 |

OTHER PUBLICATIONS

"Office Action of Japan Counterpart Application", with English translation thereof, dated Jan. 10, 2017, p. 1-p. 6.
"International Search Report (Form PCT/ISA/210) of PCT/JP2017/009183", dated May 9, 2017, with English translation thereof, pp. 1-2.
"Search Report of Europe Counterpart Application", dated Nov. 8, 2019, p. 1-p. 7.

*Primary Examiner* — Lawrence D Ferguson
(74) *Attorney, Agent, or Firm* — JCIPRNET

(57) ABSTRACT

The purpose of the present invention is to provide a thermal conductive insulating sheet which has achieved a good balance between insulating properties and thermal conductivity higher than ever before. A thermal conductive insulating sheet according to the present invention contains a thermal conductive spherical filler (excluding boron nitride), a boron nitride filler and a binder resin, and has a plurality of layers (A) that mainly contain the thermal conductive spherical filler (excluding boron nitride) and one or more layers (B) that mainly contain the boron nitride filler, with the layers (A) and the layers (B) being alternately laminated so that layers (A) form the outermost layers.

12 Claims, No Drawings

THERMAL CONDUCTIVE INSULATING SHEET, METHOD FOR PRODUCING SAME, AND INTERMEDIATE LAMINATE

CROSS-REFERENCE TO RELATED APPLICATION

This application is a 371 application of the International PCT application serial no. PCT/JP2017/009183, filed on Mar. 8, 2017, which claims the priority benefits of Japan Patent Application No. 2016-045514, filed on Mar. 9, 2016, and Japanese Patent Application No. 2016-230822, filed on Nov. 29, 2016. The entirety of each of the abovementioned patent applications is hereby incorporated by reference herein and made a part of this specification.

TECHNICAL FIELD

The present invention relates to a thermal conductive insulating sheet and a method for producing the same.

BACKGROUND ART

In thermal conductive sheets that release heat of electronic components, both high thermal conductivity and insulating properties are required. Boron nitride is a highly thermal conductive substance having insulating properties. One form of boron nitride is a scaly particle. In a scaly boron nitride particle, thermal conductivity in a direction parallel to a scaly surface (that is, a surface direction of a thermal conductive sheets) tends to be high, but thermal conductivity in a direction orthogonal to a scaly surface (that is, a thickness direction of a thermal conductive sheets) tends to be low.

Thus, in order to improve thermal conductivity of a thermal conductive sheets in a film thickness direction, it is preferable that boron nitride "stand" in the sheet.

As a technique for causing boron nitride to "stand," there is a technique using granules obtained by granulating boron nitride primary particles. However, when a pressure is applied to thermal conductive sheets interposed between a heat source and a heat dissipation member, granules may collapse, boron nitride primary particles may fall down, and the thermal conductivity may be lowered.

Patent Literature 1 discloses a technique in which hard boron nitride granules having low porosity are used so that the collapse of boron nitride granules due to a pressure is prevented and a reduction in thermal conductivity is limited.

Patent Literature 2 discloses a technique in which soft and easily deformable boron nitride granules are used, deformation is performed to an extent that the granules do not completely collapse, a pressure is thus relieved, and a reduction in thermal conductivity is limited.

Patent Literature 3 discloses a technique in which a smooth adhesive layer is bonded to a layer containing a thermal conductive filler such as boron nitride to fill irregularities on the surface of the layer containing the thermal conductive filler, and thus the adhesive strength is improved.

Patent Literature 4 discloses a multi-layer resin sheet including a resin layer that contains 3 types of thermal conductive fillers with different sizes, and an adhesive layer that is disposed on at least one surface of the resin layer. In addition, this literature discloses that the adhesive layer may also contain a filler such as aluminum oxide.

CITATION LIST

Patent Literature

[Patent Literature 1]
Japanese Unexamined Patent Application Publication No. 2010-157563
[Patent Literature 2]
Japanese Unexamined Patent Application Publication No. 2015-34269
[Patent Literature 3]
Japanese Unexamined Patent Application Publication No. 2013-39834
[Patent Literature 4]
PCT International Publication No. WO 2012/046814

SUMMARY OF INVENTION

Technical Problem

In recent years, reductions in size and weight, and increases in density and output of electronic devices have significantly progressed in the field of electronics, and the levels of reliability and performance required have accordingly increased. For example, improvement in insulation reliability according to a high density and a high output of an electronic circuit and improvement in performance of a heat dissipation property (thermal conductivity) for preventing deterioration of an electronic member due to generated heat are strongly required.

In addition, in order to reduce a weight of a member, an attempt to overcome the above problem using a polymeric material has also begun, sheets (a thermal conductive insulating sheet, a thermal conductive insulating adhesive sheet, a thermal conductive insulating sticky sheet, and the like) having a thermal conductive insulating layer that contains a polymeric material having insulating properties and thermal conductive particles have been developed.

Thermal conductive particles used for a thermal conductive member are also being actively developed. As the thermal conductive particles, alumina, aluminum nitride, and boron nitride are preferably used in consideration of price, reliability, and thermal conductivity. For example, in an adhesive sheet having thermal conductivity for a high output device such as a power semiconductor, many development cases using boron nitride have been reported.

Incidentally, since electricity has a property of propagating at an interface between substances, electricity is likely to be transmitted at an interface between boron nitride and a binder resin as more boron nitride "stands," and insulating properties are likely to deteriorate. Similarly, when there are voids in thermal conductive sheets, electricity propagates at an air interface, and insulating properties are likely to deteriorate.

While voids can be reduced by applying a pressure to the thermal conductive sheets, since boron nitride falls down due to a pressure as described above, there is a risk of the thermal conductivity being lowered.

Therefore, in order to obtain both the thermal conductivity and insulating properties, it is necessary to improve insulating properties by reducing voids in the thermal conductive sheets as much as possible while boron nitride "stands."

Patent Literature 1 discloses use of granules with less internal voids. However, voids generated when the thermal conductive sheets are formed are not considered. In addition, in hard fillers that are not easily deformed, even if a pressure is applied, voids are not reduced and insulating properties are inferior.

Since the granules disclosed in Patent Literature 2 are easily deformed when a pressure is applied, voids are easily reduced. However, according to deformation, boron nitride granules fall down and the thermal conductivity is lowered.

Generally, in order to obtain high thermal conductivity, it is necessary to increase a boron nitride concentration. However, generally, since boron nitride has poor wettability and an irregular shape, when it is dispersed at a high concentration in a binder resin solution, it is difficult to control fluidity of a coating solution. As a result, when such a high concentration dispersion solution is applied, irregularities occur on the surface of a coating film, and voids are also likely to be formed inside the coating film. This is particularly noticeable in granulated boron nitride.

In the technique described in Patent Literature 3, while irregularities of the surface of the layer containing the thermal conductive filler are filled, since it is not possible to reduce voids inside the layer containing the thermal conductive filler, there is a limit in improvement of insulating properties particularly when a film thickness is thick.

On the other hand, when a thermal conductive filler having a higher sphericity than boron nitride granules is used, even if it is dispersed at a relatively high concentration in a binder resin, the fluidity is high, and voids are unlikely to occur in the coating film. However, a thermal conductive filler having a high sphericity has drawbacks that it has lower thermal conductivity than boron nitride, and inferior stability in a humidified state.

Patent Literature 4 discloses that the adhesive layer may also contain a filler such as aluminum oxide as described above, and describes that an amount of the filler is preferably 50 volume % or less (refer to [0101] and [0103]).

However, since an amount of the filler contained in the adhesive layer that forms an outermost layer of a multi-layer sheet is not large, it is difficult to exhibit sufficient thermal conduction performance as the entire multi-layer sheet. In addition, as in Patent Literature 3, since there are many voids inside the resin layer containing the thermal conductive filler, there is a limit in improvement of insulating properties.

Solution to Problem

An objective of the present invention is to provide a thermal conductive insulating sheet which has achieved a good balance between insulating properties and thermal conductivity higher than ever before.

A thermal conductive insulating sheet according to an aspect of the present invention includes a thermal conductive spherical filler (F1) excluding boron nitride, a powdery or granular boron nitride filler (F2), and a binder resin. The thermal conductive insulating sheet satisfies the following conditions (1) to (6):

(1) the thermal conductive insulating sheet has a porosity of 0.2 or less;

(2) the thermal conductive insulating sheet includes a plurality of layers (A) that contain a thermal conductive spherical filler (F1) and optionally contain a boron nitride filler (F2) and one or more layers (B) that contain the boron nitride filler (F2) and optionally contain the thermal conductive spherical filler (F1);

(3) the plurality of layers (A) and the one or more layers (B) are alternately laminated such that the layer (B) is not positioned on an outermost layer;

(4) a mass of the thermal conductive spherical filler (F1) that is contained in the outermost layer ($A_{out}$) among the plurality of layers (A) is relatively larger than a mass of the thermal conductive spherical filler (F1) that is optionally contained in the layer (B);

(5) a combined occupied volume ratio of the thermal conductive spherical filler (F1) and the boron nitride filler (F2) in the outermost layer ($A_{out}$) is more than 50% with respect to a total volume of 100% of the thermal conductive spherical filler (F1), the boron nitride filler (F2), and a binder resin in the outermost layer ($A_{out}$); and (6) the layer (B) includes 30 to 90 mass % of the boron nitride filler (F2) with respect to a total of 100 mass % of the thermal conductive spherical filler (F1), the boron nitride filler (F2), and the binder resin.

A method of producing a thermal conductive insulating sheet of the present invention is a method of producing a thermal conductive insulating sheet including a thermal conductive spherical filler (F1) excluding boron nitride, a powdery or granular boron nitride filler (F2), and a binder resin and having a porosity of 0.2 or less, wherein, in the method of producing a thermal conductive insulating sheet, the plurality of following sheets (A') and the following sheet of one or more layers (B') are alternately laminated such that the sheet (B') does not become an outermost layer and pressurized;

wherein the sheet (A') includes 30 to 90 mass % of the thermal conductive spherical filler (F1) and 0 to 30 mass % of the boron nitride filler (F2) with respect to a total of 100 mass % of the thermal conductive spherical filler (F1), the boron nitride filler (F2), and the binder resin, and a combined occupied volume ratio of the thermal conductive spherical filler (F1) and the boron nitride filler (F2) is more than 50% with respect to a total volume of 100% of the thermal conductive spherical filler (F1), the boron nitride filler (F2), and the binder resin, wherein the sheet (B') includes 30 to 90 mass % of the boron nitride filler (F2) and 0 to 30 mass % of the thermal conductive spherical filler (F1) with respect to a total of 100 mass % of the thermal conductive spherical filler (F1), the boron nitride filler (F2), and the binder resin, and wherein an amount of the thermal conductive spherical filler (F1) contained in the sheet (A') is relatively larger than an amount of the thermal conductive spherical filler (F1) contained in the sheet (B').

A thermal conductive insulating sheet according to another embodiment of the present invention is a thermal conductive insulating sheet including a thermal conductive spherical filler (F1), a powdery or granular boron nitride filler (F2), and a binder resin and having a porosity of 0.2 or less, wherein, in the thermal conductive insulating sheet, the following plurality of sheets (A') and the following sheet of one or more layers (B') are alternately laminated so that the sheet (B') does not become an outermost layer and pressurized, wherein the sheet (A') includes 30 to 90 mass % of the thermal conductive spherical filler (F1) and 0 to 30 mass % of the boron nitride filler (F2) with respect to a total of 100 mass % of the thermal conductive spherical filler (F1), the boron nitride filler (F2), and the binder resin, and a combined occupied volume ratio of the thermal conductive spherical filler (F1) and the boron nitride filler (F2) is more than 50% with respect to a total volume of 100% of the thermal conductive spherical filler (F1), the boron nitride filler (F2), and the binder resin, wherein the sheet (B') includes 30 to 90 mass % of the boron nitride filler (F2) and 0 to 30 mass % of the thermal conductive spherical filler (F1) with respect to a total of 100 mass % of the thermal conductive spherical filler (F1), the boron nitride filler (F2), and the binder resin, and wherein an amount of the thermal conductive spherical filler (F1) contained in the sheet (A') is relatively larger than an amount of the thermal conductive spherical filler (F1) contained in the sheet (B').

Advantageous Effects of Invention

According to the present invention, it is possible to provide a thermal conductive insulating sheet which has achieved a good balance between insulating properties and thermal conductivity higher than ever before.

DESCRIPTION OF EMBODIMENTS

A thermal conductive insulating sheet of the present invention includes a plurality of layers (A) that mainly contain a thermal conductive spherical filler (F1) (excluding boron nitride) and one or more layers (B) that mainly contain a boron nitride filler (F2) and has a structure in which the layers (A) and the layers (B) are alternately laminated such that the layer (B) does not become an outermost layer. Therefore, the thermal conductive insulating sheet of the present invention includes an odd number of layers with a minimum unit of layer (A)/layer (B)/layer (A). The outmost layer among the plurality of layers (A) is referred to as an outermost layer ($A_{out}$).

In addition, in the thermal conductive insulating sheet of the present invention, the outer side of the outermost layer ($A_{out}$) that mainly contains the thermal conductive spherical filler (F1) can be covered with a releasable sheet.

[Thermal Conductive Spherical Filler (F1)]

In this specification, "spherical" can be expressed by, for example, "circularity." "Circularity" can be obtained by the formula: (circularity)=4 $\pi S/L^2$ when an arbitrary number of particles are selected from a picture obtained by capturing particles under a scanning electron microscope (SEM) or the like, and an area of the particle is set as S and a circumference length is set as L. In this specification, unless otherwise specified, "spherical particles" refer to particles having an average circularity of 0.9 to 1 when an average circularity of particles is measured using a flow-type particle image analyzer FPIA-1000 (commercially available from Toa Medical Electronics Co., Ltd.). Preferably, the average circularity is 0.96 to 1.

The type of the thermal conductive spherical filler (F1) may be any type having thermal conductivity other than boron nitride, and, may include, for example, a metal oxide such as alumina, calcium oxide, magnesium oxide, crystalline silica, and noncrystalline silica; a metal nitride such as aluminum nitride; a metal hydroxide such as aluminum hydroxide and magnesium hydroxide; a metal carbide such as silicon carbide; a metal carbonate such as calcium carbonate and magnesium carbonate; a metal silicate such as calcium silicate; a hydrated metal compound; and combinations thereof. These can be used alone or in combinations of two or more thereof.

In consideration of sphericity, thermal conductivity, and insulating properties, the thermal conductive spherical filler (F1) is desirably selected from the group consisting of alumina and aluminum nitride.

The size of the thermal conductive spherical filler (F1) is not particularly limited, and in consideration of thermal conductivity, an average particle size is preferably in a range of 10 to 100 μm. More preferably, the average particle size is in a range of 10 to 50 μm. When the average particle size of the filler is smaller than 10 μm, an amount of filling necessary for exhibiting thermal conductivity increases. However, in this case, since the specific surface area is large, voids are likely to be formed, and there is a risk of insulating properties deteriorating. On the other hand, when the average particle size exceeds 100 μm, although thermal conductivity is advantageous, trouble during coating such as sedimentation in a coating solution may be caused.

[Boron Nitride Filler (F2)]

The form of the boron nitride filler (F2) may be powdery or granular. For example, scaly primary particles, granules obtained by granulating scaly primary particles, and an aggregate thereof can be used. Since scaly boron nitride particles have anisotropic thermal conductivity, granulated boron nitride obtained by granulating scaly primary particles is suitably used. Here, in granulated boron nitride that is unlikely to be deformed, since voids tend to remain even if a pressure is applied, particularly, easily deformable granulated boron nitride is preferably used.

Unless otherwise specified, "easily deformable granulated boron nitride" in this specification refers to an aggregate of boron nitride having an average particle size of 2 to 100 μm and an average compressive force of 5 mN or less required for a compression deformation ratio of 10%, which is obtained by granulating boron nitride particles having an average primary particle diameter of 0.1 to 15 μm.

The easily deformable granulated boron nitride is suitably used because it adjusts a pressure when a thermal conductive insulating sheet is formed and adjusts deformation to be within an appropriate range so that both a reduction in porosity and thermal conductivity are easily obtained.

In this specification, "primary particles" refers to the smallest particles that can exist alone, and "average primary particle diameter" refers to a long diameter of primary particle diameters observed under a scanning electron microscope (SEM) or the like. The "long diameter of primary particle diameters" refers to the largest diameter of primary particles for spherical particles, and refers to the largest diameter or the largest diagonal length for hexagonal plate-like or disc-like particles in a projected image of particles observed in the thickness direction. Here, the "average primary particle diameter" is calculated by measuring long diameters of 300 particles by the above method and averaging the long diameters by the number of particles.

The average compressive force required for a compression deformation ratio of 10% can be obtained by measuring a load for deforming particles, which are 10 particles that are randomly selected in a measurement area, by 10%, using a micro compression tester (commercially available from Shimadzu Corporation, MCT-210).

[Binder Resin]

A binder resin used in the present invention is not particularly limited, and includes, for example, a polyurethane resin, a polyester resin, a polyester urethane resin, an alkyd resin, a butyral resin, an acetal resin, a polyamide resin, an acrylic resin, a styrene-acryl resin, a styrene resin, nitrocellulose, benzyl cellulose, cellulose(tri)acetate, casein, shellac, gilsonite, gelatin, a styrene-maleic anhydride resin, a polybutadiene resin, a polyvinyl chloride resin, a polyvinylidene chloride resin, a polyvinylidene fluoride resin, a polyvinyl acetate resin, an ethylene vinyl acetate resin, a vinyl chloride/vinyl acetate copolymer resin, a vinyl chloride/vinyl acetate/maleic acid copolymer resin, a fluorine resin, a silicon resin, an epoxy resin, a phenoxy resin, a phenol resin, a maleic acid resin, a urea resin, a melamine resin, a benzoguanamine resin, a ketone resin, a petroleum resin, rosin, a rosin ester, polyvinyl alcohol, polyvinyl pyrrolidone, polyacrylamide, hydroxyethyl cellulose, hydroxypropyl cellulose, methyl cellulose, ethyl cellulose, hydroxyethyl methyl cellulose, hydroxypropyl methyl cellulose, carboxymethyl cellulose, carboxymethyl ethyl cellulose, carboxymethyl nitrocellulose, an ethylene/vinyl alcohol resin, a polyolefin resin, a chlorinated polyolefin resin, a modified chlorinated polyolefin resin, and a chlorinated polyurethane resin. The binder resin can be used alone or in combinations of two or more thereof.

Among the above binder resins, a urethane resin or a polyamide resin is suitably used in consideration of flexibility, and an epoxy resin is suitably used in consideration of insulating properties, heat resistance, and the like for use in an electronic component.

As the binder resin, a binder resin that cures by itself or a binder resin that is cured by a reaction with a suitable curing agent can be used.

For example, when the binder resin has a reactive group such as a carboxy group, an amino group, or a phenolic hydroxyl group, as a curing agent that can react with the reactive group, a bifunctional or higher functional epoxy group-containing compound, a bifunctional or higher functional isocyanate group-containing compound, a bifunctional or higher functional carbodiimide group-containing compound, a bifunctional or higher functional metal chelate compound, a bifunctional or higher functional metal alkoxide compound, a bifunctional or higher functional metal acylate compound, or the like can be preferably used.

The thermal conductive insulating sheet of the present invention is used between a heat source and a heat dissipation member. Thus, in order to efficiently transfer heat generated from the heat source to the heat dissipation member and ensure sufficient insulating properties, the porosity is necessarily 0.2 or less, and is more desirably 0.15 or less. When the porosity exceeds 0.2, there are risks of sufficient insulating properties not being obtained, a cohesive force of the sheet decreasing, the mechanical strength or adhesive strength decreasing, air and water easily entering the inside of the sheet, and the durability decreasing.

<Porosity>

The porosity in this specification is obtained by the following formula.

Porosity=1−(measured density of thermal conductive insulating sheet/theoretical density of thermal conductive insulating sheet)

Measured density of thermal conductive insulating sheet=mass (g) of thermal conductive insulating sheet/volume (cm$^3$) of thermal conductive insulating sheet Theoretical density of thermal conductive insulating sheet=sum (g) of masses of a plurality of sheets (A') and sheet of one or more layers (B')/sum (cm$^3$) of volumes of a plurality of sheets (A') and sheet of one or more layers (B')

Volume of sheet (A') or sheet (B')=mass (g) of sheet (A') or sheet (B')/density (g/cm$^3$) of sheet (A') or sheet (B')

General data can be used for the densities of the thermal conductive spherical filler (F1), the boron nitride filler (F2), and the like.

The densities of the binder resin and other organic components are roughly estimated as "1 (g/cm$^3$)."

When there are no voids in the thermal conductive insulating sheet, the measured density and the theoretical density are the same, and the porosity becomes 0.

When the volume is infinitely large with respect to the actually measured mass of the thermal conductive insulating sheet, the measured density≅0 and the porosity≅1.

When the thermal conductive insulating sheet contains voids and the measured density is lower than the theoretical density, the porosity has a value of 0 to 1.

Here, when it is difficult to measure the porosity while the thermal conductive insulating sheet is interposed between the heat source and the heat dissipation member, when a releasable sheet is adhered to the thermal conductivity insulating sheet, pressurizing pressing is performed under the same conditions as in interposition use, and then the porosity can be measured.

When the porosity is predicted while the thermal conductive insulating sheet is interposed between the heat source and the heat dissipation member, it is possible to set use conditions of the thermal conductive insulating sheet.

The thermal conductive insulating sheet of the present invention can be produced by alternately laminating the following plurality of sheets (A') and the following sheet of one or more layers (B') such that the following sheet (B') does not become the outermost layer and performing pressurizing.

The sheet (A') includes 30 to 90 mass % of the thermal conductive spherical filler (F1) and 0 to 30 mass % of the boron nitride filler (F2) with respect to a total of 100 mass % of the thermal conductive spherical filler (F1), the boron nitride filler (F2), and the binder resin, and a combined occupied volume ratio of the thermal conductive spherical filler (F1) and the boron nitride filler (F2) is more than 50% with respect to a total volume of 100% of the thermal conductive spherical filler (F1), the boron nitride filler (F2), and the binder resin.

The sheet (B') includes 30 to 90 mass % of the boron nitride filler (F2) and 0 to 30 mass % of the thermal conductive spherical filler (F1) with respect to a total of 100 mass % of the thermal conductive spherical filler (F1), the boron nitride filler (F2), and the binder resin.

An amount of the thermal conductive spherical filler (F1) contained in the sheet (A') is relatively larger than an amount of the thermal conductive spherical filler (F1) contained in the sheet (B').

Here, an intermediate laminate before pressurization is also new and is included in the present invention. In the intermediate laminate for producing the thermal conductive insulating sheet of the present invention, the plurality of sheets (A') and the sheet of one or more layers (B') are alternately laminated such that the sheet (B') does not become the outermost layer. The intermediate laminate before pressurization has a porosity of 0.3 or less.

The thermal conductive insulating sheet of the present invention is obtained by, for example, pressurizing both surfaces of the sheet (B') that mainly contains the boron nitride filler (F2) and has many voids interposed between two sheets (A') that mainly contain the thermal conductive spherical filler (F1).

In the sheet (A') that mainly contains the thermal conductive spherical filler (F1), since the contained filler is spherical, it is assumed that the sheet (A') is easily deformed by pressurization and heating even in a solvent-free state. As a result, it is assumed that the thermal conductive spherical filler (F1) positioned in the vicinity of the laminate interface with the sheet (B') and the binder, which are contained in in the sheet (A'), and a part of the boron nitride filler (F2), which may be contained, fill voids in the sheet (B') having many voids by pressurization and heating, and the porosity of the entire thermal conductive insulating sheet can be reduced.

In addition, it is assumed that, when the layer (A) that contains the thermal conductive spherical filler (F1) and is easily deformed is positioned as the outermost layer, it is possible to improve conformability and adhesion with respect to irregularities of the heat source and the heat dissipation member and it is possible to improve the thermal conductivity in this regard.

Here, by pressurization and heating, a certain amount of the thermal conductive spherical filler (F1) and the binder resin which are contained in the sheet (A') and the boron nitride filler (F2) that may be contained are transferred to the sheet (B'), and there is no method for identifying whether pores of the sheet (B') are filled (or an unrealistic amount of time and effort is necessary for identification). Then, since the binder resin, the thermal conductive spherical filler (F1), and the boron nitride filler (F2) used in the present invention are nonvolatile components, it is assumed that an occupied volume ratio to be described below does not change before and after the sheet (A') and the sheet (B') are pressurized and heated, and for convenience, the amount of each component contained in the sheet (A') is set as an amount in the layer ($A_{out}$) and the occupied volume ratio is obtained.

<Sheet (A')>

The sheet (A') that contains the thermal conductive spherical filler (F1) includes 30 to 90 mass % of the thermal conductive spherical filler (F1) and 0 to 30 mass % of the boron nitride filler (F2) with respect to a total of 100 mass % of the thermal conductive spherical filler (F1), the boron nitride filler (F2), and the binder resin and the sheet (A') contains a relatively larger amount of the thermal conductive spherical filler (F1) than the sheet (B') that mainly contains the boron nitride filler (F2).

A concentration of the thermal conductive spherical filler (F1) in the sheet (A') is 30 mass % or more in consideration of the thermal conductivity and is 90 mass % or less in consideration of film forming properties, and is desirably in a range of 50 to 80 mass %.

When the thermal conductive insulating sheet of the present invention is produced, alternate lamination is performed such that the sheet (A') containing a relatively larger amount of the thermal conductive spherical filler (F1) than the sheet (B') becomes the outermost layer, and thus it is possible to improve conformability and adhesion with respect to irregularities of the heat source and the heat dissipation member as described above.

The sheet (A') may contain the boron nitride filler (F2) in a range of 30 mass % or less. When the boron nitride filler (F2) is used in combination, it is possible to improve the thermal conductivity of the sheet (A'). However, when a content of the boron nitride filler (F2) is larger than 30 mass %, there is a risk of an effect of reducing voids when laminated on the sheet (B') becoming insufficient.

The boron nitride filler (F2) that is optionally used in the sheet (A') may be the same as or different from the boron nitride filler (F2) used in the layer (B) that contains the boron nitride filler (F2).

The sheet (A') becomes the outermost layer ($A_{out}$) in the thermal conductive insulating sheet, and is a layer that is in direct contact with the heat source or the heat dissipation member, and high thermal conductivity is required in addition to adhesion. Thus, in the outermost layer ($A_{out}$) or in the sheet (A') serving as the outermost layer ($A_{out}$), it is important that a combined occupied volume ratio of the thermal conductive spherical filler (F1) and the boron nitride filler (F2) be more than 50% with respect to a total volume of 100% of the thermal conductive spherical filler (F1), the boron nitride, and the binder resin. In consideration of practical physical properties such as adhesion, more than 50% and 90% or less is more preferable.

Here, the occupied volume ratio (sometimes abbreviated as "vol %") can be calculated as follows.

Mass (g) of thermal conductive spherical filler (F1)÷filler specific gravity (g/cm$^3$) (1)

Mass (g) of boron nitride filler (F2)÷specific gravity (g/cm$^3$) of boron nitride filler (F2) (2)

Components (g) other than thermal conductive filler÷1 (g/cm$^3$) (3)

vol %=100×{((1)+(2))/((1)+(2)+(3))}

In the above calculation, the specific gravity of components other than the thermal conductive filler is set to 1 g/cm$^3$ for easy calculation.

Here, in the present invention, as described above, since the binder resin, the thermal conductive spherical filler (F1), and the boron nitride filler (F2) used are nonvolatile components, it is assumed that the above occupied volume ratio does not change before and after the sheet (A') and the sheet (B') are pressurized and heated.

<Sheet (B')>

The sheet (B') that contains the boron nitride filler (F2) is used to form the layer (B) that contains the boron nitride filler (F2), and has high thermal conductivity, and has a function of increasing the thermal conductivity of the entire thermal conductive insulating sheet.

The sheet (B') includes 30 to 90 mass % of the boron nitride filler (F2) and 0 to 30 mass % of the thermal conductive spherical filler (F1) with respect to a total of 100 mass % of the thermal conductive spherical filler (F1), the boron nitride filler (F2), and the binder resin.

A concentration of the boron nitride filler (F2) in the sheet (B') is 30 mass % or more in consideration of the thermal conductivity and is 90 mass % or less in consideration of film forming properties and is desirably in a range of 40 to 80 mass %.

In the sheet (B'), the thermal conductive spherical filler (F1) in a range of 30 mass % or less may be used in combination.

When the thermal conductive spherical filler (F1) is used in combination for scaly boron nitride particles, the thermal conductive spherical filler (F1) has a function of a baffle plate, and the scaly boron nitride particles are likely to "stand" in the sheet (B') and the layer (B) that contains the boron nitride filler (F2).

When the thermal conductive spherical filler (F1) is used in combination for granulated boron nitride, there is a tendency that granulated boron nitride is unlikely to collapse even if a pressure is applied. However, when an amount of the thermal conductive spherical filler (F1) exceeds 30 mass %, there are risks that an amount of the boron nitride filler (F2) in the sheet (B') is relatively smaller so that the thermal conductivity decreases, and an amount of the binder resin is insufficient so that film forming properties deteriorate.

The thermal conductive spherical filler (F1) that is optionally used may be the same as or different from the thermal conductive spherical filler (F1) used in the sheet (A').

The sheets (A') and (B') each can contain a flame retardant, a filler, and various other additives as necessary.

Examples of the flame retardant include aluminum hydroxide, magnesium hydroxide, and a phosphoric acid compound.

Examples of the additive include a coupling agent for improving a substrate adhesion, an ion scavenger and an antioxidant for improving reliability during moisture absorption and at high temperatures, and a leveling agent.

The thermal conductive insulating sheet of the present invention can be produced by, for example, the following method.

A coating solution (A") that contains 30 to 90 mass % of the thermal conductive spherical filler (F1), 0 to 30 mass % of the boron nitride filler (F2) (provided that a total amount of the thermal conductive spherical filler (F1), the boron nitride filler (F2), and the binder resin is 100 mass %), a liquid dispersion medium, and other optional components as necessary is prepared. The coating solution (A") is applied to a releasable sheet, the liquid dispersion medium is then volatilized and dried, and thereby a sheet with a releasable (A') sheet is produced.

Separately, in the same manner as above, a coating solution (B") that contains 30 to 90 mass % of the boron nitride filler (F2), 0 to 30 mass % of the thermal conductive spherical filler (F1) (provided that a total amount of the thermal conductive spherical filler (F1), the boron nitride filler (F2), and the binder resin is 100 mass %), a liquid dispersion medium, and other optional components as necessary is prepared. The coating solution (B") is applied to a releasable sheet, the liquid dispersion medium is then volatilized and dried, and thereby a sheet with a releasable sheet (B') is produced.

Thereafter, the side opposite to the releasable sheet of the sheet with a releasable sheet (B') and the side opposite to the releasable sheet of the sheet with a releasable sheet (A') are superimposed on each other. During superimposing, pressurization may be performed.

Next, the releasable sheet covering the surface of the sheet (B') is peeled off and the side opposite to the releasable sheet of another sheet with a releasable sheet (A') is superimposed on the exposed surface of the sheet (B'), and thereby a laminate having a lamination structure of [releasable sheet/sheet (A')/sheet (B')/sheet (A')/releasable sheet] is obtained.

Then, when the laminate is pressurized, sheet (A')/sheet (B')/sheet (A') are integrated, the releasable sheets on both surfaces are peeled off, and thereby a thermal conductive insulating sheet having a lamination structure of "[outermost layer ($A_{out}$)/layer (B)/outermost layer ($A_{out}$)] is obtained.

Here, the releasable sheets on both surfaces are peeled off and then pressurization may be performed.

A pressurization and compression method is not particularly limited, and a known laminator or press processing machine can be used. Heating is preferably performed during pressurization.

As a lamination structure of the thermal conductive insulating sheet, in addition to the most basic structure of "[outermost layer ($A_{out}$)/layer (B)/outermost layer ($A_{out}$)], "[outermost layer ($A_{out}$)/layer (B)/layer (A)/layer (B)/outermost layer ($A_{out}$)], "[outermost layer ($A_{out}$)/layer (B)/layer (A)/layer (B)/layer (A)/layer (B)/outermost layer ($A_{out}$)], and the like may be used.

The coating solution (A") for forming the sheet (A') and the coating solution (B") for forming the sheet (B') can be produced by stirring and mixing together the thermal conductive spherical filler (F1) and/or the boron nitride filler (F2), the binder resin, a solvent and other optional components as necessary.

A general stirring method can be used for stirring and mixing. A stirring and mixing machine is not particularly limited, and, for example, Disper, Scandex, a paint conditioner, a sand mill, a grinding machine, a media-less dispersion machine, a three-roll mill, and a bead mill, may be used.

After stirring and mixing, in order to remove air bubbles from the coating solution (A") and the coating solution (B"), a deaeration process is preferably performed. A deaeration method is not particularly limited, and, for example, vacuum deaeration, and ultrasonic wave deaeration may be used.

Examples of the releasable sheet include sheets obtained by performing a release treatment on a plastic film such as a polyester film, a polyethylene film, a polypropylene film, or a polyimide film.

A method of applying the coating solution (A") or the coating solution (B") to a releasable sheet is not particularly limited, and, for example, knife coating, blade coating, comma coating, die coating, lip coating, roll coating, curtain coating, bar coating, gravure coating, flexo coating, dip coating, spray coating, screen coating, a dispenser, an inkjet, and spin coating may be used.

The film thickness of the sheet (A') and the sheet (B') and a coating mass per unit area are not particularly limited. When the film thickness of the sheet (A') is relatively sufficiently thick with respect to the film thickness of the sheet (B'), voids can be effectively reduced by lamination. For example, in the case of the thermal conductive insulating sheet having a lamination structure of [layer (A)/layer (B)/layer (A)], the film thickness of the sheet (A') for forming the layer (A) is preferably about half of the film thickness of the sheet (B') for forming the layer (B). However, the thicknesses of the sheets can be determined in consideration of pressurization and heating conditions during lamination while observing the porosity and thermal conductivity of the finally obtained [layer (A)/layer (B)/layer (A)].

The temperature and pressure during pressurization and compression can be appropriately selected. However, when the pressure is too high, the boron nitride filler (F2) "falls down" and thus there is a risk of the thermal conductivity being lowered. When the pressure is too low, voids remain in the sheet, and there is a risk of the thermal conductivity being lowered when the sheet interposed between the heat source and the heat dissipation member is used.

A pressurizing pressing method is not particularly limited, and a known press processing machine, a laminator, and the like can be used. The temperature during pressurizing pressing can be appropriately selected. For example, when the sheet is used as a thermosetting adhesive sheet, heating is desirably performed to a temperature at which thermal curing of the binder resin is caused or higher. A method in which the pressure of an atmosphere is reduced, a difference between it and atmospheric pressure is provided, and thus pressurizing pressing is performed may be used.

The thermal conductive insulating sheet of the present invention is used to mainly connect the heat source such as an electronic member and the heat dissipation member and release heat efficiently. An object from which heat is released is not particularly limited, and an object that is likely to be heated and from which heat needs to be released to the outside in order to prevent performance degradation and the like is exemplified. For example, various electronic components such as an integrated circuit, an IC chip, a hybrid package, a multi-module, a power transistor, a power semiconductor package, a surface resistor, and a light emitting diode (LED) substrate; building materials; vehicles, aircrafts, and ships are exemplified.

EXAMPLES

The present invention will be described below in further detail with reference to examples, but the following examples do not limit the scope of the present invention. Here, unless otherwise specified in the examples, "parts"

and "%" indicate "parts by mass," and "mass %." Mw indicates a weight average molecular weight, and Mn indicates a number average molecular weight.

<Filler>

A list of the thermal conductive spherical filler (F1) and the boron nitride filler (F2) used is shown in Table 1.

Resin Synthesis Example 1

86.8 parts by mass of Pripol 1009 (commercially available from Croda Japan) as a polybasic acid compound, 27.3 parts by mass of 5-hydroxyisophthalic acid, 146.4 parts by mass of Priamine 1074 (commercially available from Croda Japan) as a polyamine compound, and 100 parts by mass of deionized water were put into a 4-neck flask including a stirrer, a reflux condenser pipe, a nitrogen introduction pipe, an introduction pipe, and a thermometer, and the mixture was stirred until a heating temperature became constant. After the temperature was stabilized, the temperature was raised to 110° C. In addition, the temperature was raised to 120° C. 30 minutes after outflow of water was confirmed. Then, a dehydration reaction continued while the temperature was raised by 10° C. at 30 minute intervals. After the temperature reached 230° C., the temperature was maintained and the reaction continued for 3 hours. In addition, after the mixture was left under a vacuum of about 2 kPa for 1 hour, the temperature was lowered.

Finally, an antioxidant was added, and when the temperature reached 100° C. or lower, dilution was performed using a mixed solvent of toluene and 2-propanol (mass ratio of 1/1). As described above, a solution of a phenolic hydroxyl group-containing polyamide resin (resin 1) having a solid content of 40%, an Mw of 19,000, an acid value of 14.5 mgKOH/g, and a phenolic hydroxyl value of 32.3 mgKOH/g was obtained.

Resin Synthesis Example 2

401.9 parts by mass of a polyester polyol ("Kuraray Co., Ltd. polyol P-1011," Mn=1006 commercially available from Kuraray Co., Ltd.) obtained from terephthalic acid, adipic acid, and 3-methyl-1,5-pentanediol, 12.7 parts by mass of dimethylol butanoic acid, 151.0 parts by mass of isophorone diisocyanate, and 40 parts by mass of toluene were put into a reaction container including a stirrer, a thermometer, a reflux condenser, a dropping device, and a nitrogen introduction pipe, and the mixture was reacted under a nitrogen atmosphere at 90° C. for 3 hours. 300 parts by mass of toluene was added thereto and thereby a urethane prepolymer solution having an isocyanate group was obtained.

Next, 815.1 parts by mass of the obtained urethane prepolymer solution having an isocyanate group was added to a solution obtained by mixing 27.8 parts by mass of isophoronediamine, 3.2 parts by mass of di-n-butylamine, 342.0 parts by mass of 2-propanol, and 396.0 parts by mass of toluene, and the mixture was reacted at 70° C. for 3 hours. After the reaction ended, dilution was performed using a mixed solvent of 144.0 parts by mass of toluene and 72.0 parts by mass of 2-propanol. As described above, a solution of a polyurethane polyurea resin (resin 2) having a solid content of 30%, an Mw of 54,000, and an acid value of 8 mgKOH/g was obtained.

<Curing Agent>

As a curing agent, a 50% toluene solution of a bisphenol A type epoxy resin (Epikote 1001 commercially available from Japan Epoxy Resin) was prepared.

<Solvent>

As a solvent, a mixed solvent in which toluene and 2-propanol were mixed at a mass ratio of 1:1 was prepared.

<Average Particle Size>

The average particle size of the thermal conductive spherical filler (F1) was measured using a particle size distribution meter (Mastersizer 2000 commercially available from Malvern Instruments). A dry unit was used during measurement, and an air pressure was set to 2.5 bar. A feed speed was optimized according to samples.

<Circularity>

The circularity of the thermal conductive spherical filler (F1) was measured using a flow-type particle image analyzer (FPIA-1000 commercially available from Toa Medical Electronics Co., Ltd.). About 5 mg of measurement particles were dispersed in 10 ml of toluene to prepare a dispersion solution, and ultrasonic waves (20 kHz, 50 W) were emitted to the dispersion solution for 5 minutes. A concentration of the dispersion solution was set to 5,000 to 20,000 pieces/µl. Measurement was performed by the above device using this dispersion solution, the circularities of particle groups with equivalent circular diameters were measured and an average circularity was obtained.

<Average Compressive Force Required for Compression Deformation Ratio of 10%>

An average compressive force required for a compression deformation ratio of 10% of an easily deformable aggregate was measured using a micro compression tester (MCT-210 commercially available from Shimadzu Corporation). Regarding 10 particles that were randomly selected in a measurement area, a load for deforming the particles by 10% was measured, and an average value thereof was set as an average compressive force required for a compression deformation ratio of 10%.

<Porosity>

The porosity of the thermal conductive insulating sheet before pressing and after pressing was calculated using the following formula.

Porosity=1−(measured density of thermal conductive insulating sheet/theoretical density of thermal conductive insulating sheet)

Measured density of thermal conductive insulating sheet=mass (g) of thermal conductive insulating sheet/volume (cm$^3$) of thermal conductive insulating sheet Theoretical density of thermal conductive insulating sheet=sum (g) of masses of a plurality of sheets (A') and sheet of one or more layers (B')/sum (cm$^3$) of volumes of a plurality of sheets (A') and sheet of one or more layers (B')

Volume of sheet (A') or sheet (B')=mass (g) of sheet (A') or sheet (B')/density (g/cm$^3$) of sheet (A') or sheet (B')

General data was able be used for the densities of the thermal conductive spherical filler (F1), the boron nitride filler (F2), and the like.

The densities of the binder resin and other organic components were roughly estimated as "1 (g/cm$^3$)."

<Sheet 1A'> Production Example 8.6 parts by mass of the solution of the resin 1 obtained in the resin synthesis example 1, 2.7 parts by mass of the curing agent, and 13.5 parts by mass of the mixed solvent were mixed together. 21 parts by mass of spherical alumina (ADMAFINE AO-509 commercially available from Admatechs, hereinafter referred to as a "thermal conductive spherical filler (F1-1)") having an average circularity of 0.99 and an average particle size of 10 μm and 4.2 parts by mass of the granulated boron nitride filler (F2) (Agglomerates 100 commercially available from 3M Japan, hereinafter referred to as a "boron nitride filler (F2-1)") having an average compressive force of 1.32 mN required for a compression deformation ratio of 10% and an average particle size of 65 to 85 μm were added to this solution.

After stirring the dispersion, a coating solution obtained by deaeration using an ultrasonic stirrer for 2 minutes was applied to a releasable sheet (a release-treated polyethylene terephthalate film with a thickness of 75 μm) using a 6 MIL blade coater, and dried at 100° C. for 2 minutes. As described above, an intermediate laminate 1A' in which one surface of a sheet 1A' with a theoretical film thickness of 34 μm derived from a coating amount per unit area and a theoretical density calculated below was covered with a releasable sheet was obtained.

Mass % of the thermal conductive spherical filler (F1) and mass % of the boron nitride filler contained in the sheet 1A' calculated from the composition were as follows.

$$\text{Mass \% of thermal conductive spherical filler } (F1) =$$
$$(\text{mass of thermal conductive spherical filler } (F1)/\text{sum}$$
$$\text{of dry masses of components of sheet } 1A') \times$$
$$100 = [21.0/(8.6 \times 0.4 + 2.7 \times 0.5 + 21.0 + 4.2)] \times 100 = 70$$
$$\text{Mass \% of boron nitride filler } (F2) =$$
$$(\text{mass of boron nitride filler } (F2)/\text{sum of}$$
$$\text{dry masses of components of sheet } 1A') \times$$
$$100 = [4.2/(8.6 \times 0.4 + 2.7 \times 0.5 + 21.0 + 4.2)] \times 100 = 14$$
$$\text{Theoretical density of sheet } 1A' \text{ calculated from composition} =$$
$$(\text{sum of dry masses of components of sheet } 1A')/$$
$$(\text{sum of dry volumes of components of sheet } 1A') =$$
$$(\text{dry mass of resin 1} + \text{dry mass of curing agent} +$$
$$\text{mass of thermal conductive spherical filler } (F1) +$$
$$\text{mass of boron nitride filler } (F2))/[$$
$$(\text{dry mass of resin 1/density of resin 1}) +$$
$$(\text{dry mass of curing agent/density of curing agent}) +$$
$$(\text{mass of thermal conductive spherical filler } (F1)/\text{density of}$$
$$\text{thermal conductive spherical filler } (F1)) + (\text{mass of boron}$$
$$\text{nitride filler } (F2)/\text{density of boron nitride filler } (F2))] =$$
$$(8.6 \times 0.4 + 2.7 \times 0.5 + 21.0 + 4.2)/[(8.6 \times 0.4/1) +$$
$$(2.7 \times 0.5/1) + (21.0/3.9) + (4.2/2.3)] = 2.50$$

A combined occupied volume ratio (vol %) of the thermal conductive spherical filler (F1) and the boron nitride filler (F2) in the sheet 1A' calculated from the composition was as follows.

(1) mass (g) of thermal conductive spherical filler
$$(F1) \div \text{filler specific gravity } (g/cm^3) = 21/3.9 = 5.38 \ (cm^3)$$

-continued (2) mass (g) of boron nitride filler $(F2) \div$ filler
$$\text{specific gravity } (g/cm^3) = 4.2/2.3 = 1.83 \ (cm^3)$$
(3) components (g) other than thermal conductive filler $\div 1 \ (g/cm^3) =$
$$((8.6 \times 0.4) + (2.7 \times 0.5))/1 = (3.44 + 1.35)/1 = 4.79$$
$$vol \% = 100 \times \{((1) + (2))/((1) + (2) + (3))\}$$
$$= 100 \times \{(5.38 + 1.83)/(5.38 + 1.83 + 4.79)\}$$
$$= 60 \ (vol \%)$$

<Sheet 3A'> Production Example 15 parts by mass of the solution of the resin 2 obtained in the resin synthesis example 2, 0.6 parts by mass of the curing agent, and 9.2 parts by mass of the mixed solvent were mixed together. 21 parts by mass of the thermal conductive spherical filler (F1-1) and 4.2 parts by mass of the boron nitride filler (F2-1) were added to this solution.

After stirring the dispersion, in the same manner as in the sheet 1A', an intermediate laminate 3A' in which one surface of the sheet 3A' was covered with a releasable sheet was obtained using a coating solution obtained by deaeration using an ultrasonic stirrer for 2 minutes.

<Sheet 4A'> Production Example

An intermediate laminate 4A' in which one surface of a sheet 4A' was covered with a releasable sheet was obtained in the same manner as in the sheet 1A' except that 21 parts by mass of spherical aluminum nitride (H grade commercially available from Tokuyama Corporation, hereinafter referred to as a "thermal conductive spherical filler (F1-2)") having an average circularity of 0.97 and an average particle size of 1 μm was used in place of the thermal conductive spherical filler (F1-1).

<Sheet 5A'> Production Example

An intermediate laminate 5A' in which one surface of a sheet 5A' was covered with a releasable sheet was obtained in the same manner as in the sheet 1A' except that an amount of the solution of the resin 1 obtained in the resin synthesis example 1 was 6.5 parts by mass, an amount of the curing agent was 2 parts by mass, an amount of a mixed solvent was 15.1 parts by mass, an amount of the thermal conductive spherical filler (F1-1) was 26.4 parts by mass, and the boron nitride filler (F2-1) was not used.

<Sheet 6A'> Production Example 12.4 parts by mass of the solution of the resin 1 obtained in the resin synthesis example 1, 3.9 parts by mass of the curing agent, and 10.6 parts by mass of the mixed solvent were mixed together. 16.5 parts by mass of spherical alumina (CB-A20S commercially available from Showa Denko, hereinafter referred to as a "thermal conductive spherical filler (F1-3)") having an average circularity of 0.98 and an average particle size of 21 μm, and 6.6 parts by mass of the boron nitride filler (F2-1) were added to this solution. After stirring the dispersion, in the same manner as in the sheet 1A', an intermediate laminate 6A' in which one surface of a sheet 6A' was covered with a releasable sheet was obtained using a coating solution obtained by deaeration using an ultrasonic stirrer for 2 minutes.

<Sheet 7A'> Production Example

An intermediate laminate 7A' in which one surface of a sheet 7A' was covered with a releasable sheet was obtained in the same manner as in the sheet 1A' except that 4.2 parts by mass of the granulated boron nitride filler (F2) (PTX-60 commercially available from Momentive, hereinafter referred to as a "boron nitride filler (F2-2)") having an average compressive force of 3.6 mN required for a compression deformation ratio of 10% and an average particle size of 55 to 65 μm was used in place of the boron nitride filler (F2-1).

<Sheet 9A'> Production Example

An intermediate laminate 9A' in which one surface of a sheet 9A' was covered with a releasable sheet was obtained in the same manner as in the sheet 1A' except that the composition of the coating solution included 4.5 parts by mass of the solution of the resin 1 obtained in the resin synthesis example 1, 1.4 parts by mass of the curing agent, 21.6 parts by mass of the mixed solvent, 17.5 parts by mass of the thermal conductive spherical filler (F1-1), and 5 parts by mass of the boron nitride filler (F2-1).

<Sheet 10A'> Production Example

An intermediate laminate 10A' in which one surface of a sheet 10A' was covered with a releasable sheet was obtained in the same manner as in the sheet 1A' except that the composition of the coating solution included 8.6 parts by mass of the solution of the resin 1 obtained in the resin synthesis example 1, 2.7 parts by mass of the curing agent, 13.5 parts by mass of the mixed solvent, 21 parts by mass of spherical alumina (DAW-45 commercially available from Denka Company Limited, hereinafter referred to as a "thermal conductive spherical filler (F1-4)") having an average circularity of 0.98 and an average particle size of 41 μm, and 4.2 parts by mass of the boron nitride filler (F2-2).

<Sheet 11A'> Production Example

An intermediate laminate 11A' in which one surface of a sheet 11A' was covered with a releasable sheet was obtained in the same manner as in the sheet 1A' except that the composition of the coating solution included 8.6 parts by mass of the solution of the resin 1 obtained in the resin synthesis example 1, 2.7 parts by mass of the curing agent, 13.5 parts by mass of the mixed solvent, 21 parts by mass of the thermal conductive spherical filler (F1-3), and 4.2 parts by mass of the scaly boron nitride filler (F2) ("Platelets015" commercially available from 3M Japan, hereinafter referred to as a "boron nitride filler (F2-3)") having an average particle size of 13 to 16 μm.

<Sheet 1B'> Production Example

An intermediate laminate 1B' in which one surface of a sheet 1B' having a theoretical film thickness of 51 μm was covered with a releasable sheet was obtained in the same manner as in the sheet 1A' except that the composition of the coating solution included 8.1 parts by mass of the solution of the resin 1 obtained in the resin synthesis example 1, 2.5 parts by mass of the curing agent, 21.4 parts by mass of the mixed solvent, 6.5 parts by mass of thermal conductive spherical alumina 1, and 11.5 parts by mass of the boron nitride filler (F2-1). A theoretical density of the sheet 1B' obtained by performing calculation as in the sheet 1A' was 2.02.

<Sheet 3B'> Production Example

An intermediate laminate 3B' in which one surface of a sheet 3B' was covered with a releasable sheet was obtained in the same manner as in the sheet 1B' except that the composition of the coating solution included 14.1 parts by mass of the solution of the resin 2 obtained in the resin synthesis example 2, 0.6 parts by mass of the curing agent, 17.4 parts by mass of the mixed solvent, 6.5 parts by mass of the thermal conductive spherical filler (F1-1), and 11.5 parts by mass of the boron nitride filler (F2-1).

<Sheet 4B'> Production Example

An intermediate laminate 4B' in which one surface of a sheet 4B' was covered with a releasable sheet was obtained in the same manner as in the sheet 1B' except that 6.5 parts by mass of the thermal conductive spherical filler (F1-2) in place of the thermal conductive spherical filler (F1-1), and 11.5 parts by mass of the granulated boron nitride filler (F2-1) was used.

<Sheet 5B'> Production Example

An intermediate laminate 5B' in which one surface of a sheet 5B' was covered with a releasable sheet was obtained in the same manner as in the sheet 1B' except that an amount of the solution of the resin 1 obtained in the resin synthesis example 1 was 9.3 parts by mass, an amount of the curing agent was 2.9 parts by mass, an amount of the mixed solvent was 22.9 parts by mass, an amount of the boron nitride filler (F2-1) was 14.8 parts by mass, and the thermal conductive spherical filler (F1) was not used.

<Sheet 6B'> Production Example

An intermediate laminate 6B' in which one surface of a sheet 6B' was covered with a releasable sheet was obtained in the same manner as in the sheet 1B' except that the composition of the coating solution included 8.1 parts by mass of the solution of the resin 1 obtained in the resin synthesis example 1, 2.5 parts by mass of the curing agent, 21.4 parts by mass of the mixed solvent, 6.5 parts by mass of the thermal conductive spherical filler (F1-3), and 11.5 parts by mass of the boron nitride filler (F2-1).

<Sheet 7B'> Production Example

An intermediate laminate 7B' in which one surface of a sheet 7B' was covered with a releasable sheet was obtained in the same manner as in the sheet 1B' except that the composition of the coating solution included 12.9 parts by mass of the solution of the resin 1 obtained in the resin synthesis example 1, 4.1 parts by mass of the curing agent, 17.7 parts by mass of the mixed solvent, 5 parts by mass of the thermal conductive spherical filler (F1-1), and 10.4 parts by mass of the boron nitride filler (F2-2).

<Sheet 8B'> Production Example

An intermediate laminate 8B' in which one surface of a sheet 8B' was covered with a releasable sheet was obtained in the same manner as in the sheet 1B' except that the composition of the coating solution included 5.7 parts by mass of the solution of the resin 1 obtained in the resin synthesis example 1, 1.8 parts by mass of the curing agent, 23.2 parts by mass of the mixed solvent, 6.1 parts by mass of the thermal conductive spherical filler (F1-1), and 13.3 parts by mass of the scaly boron nitride filler (F2) (Platelets009 commercially available from 3M Japan, hereinafter referred to as a "boron nitride filler (F2-4)") having a particle size of 8 to 11 μm.

<Sheet 9B'> Production Example

An intermediate laminate 9B' in which one surface of a sheet 9B' was covered with a releasable sheet was obtained in the same manner as in the sheet 1B' except that the composition of the coating solution included 22.9 parts by mass of the solution of the resin 1 obtained in the resin synthesis example 1, 7.2 parts by mass of the curing agent, 7.7 parts by mass of the mixed solvent, 6.5 parts by mass of the thermal conductive spherical filler (F1-1), and 5.8 parts by mass of the boron nitride filler (F2-1).

<Sheet 10B'> Production Example

An intermediate laminate 10B' in which one surface of a sheet 10B' was covered with a releasable sheet was obtained in the same manner as in the sheet 1B' except that the composition of the coating solution included 8.1 parts by mass of the solution of the resin 1 obtained in the resin synthesis example 1, 2.5 parts by mass of the curing agent, 21.4 parts by mass of the mixed solvent, 6.5 parts by mass of the thermal conductive spherical filler (F1-4), and 11.5 parts by mass of the boron nitride filler (F2-2).

<Sheet 11B'> Production Example

An intermediate laminate 11B' in which one surface of a sheet 11B' was covered with a releasable sheet was obtained in the same manner as in the sheet 1B' except that the composition of the coating solution included 8.1 parts by mass of the solution of the resin 1 obtained in the resin synthesis example 1, 2.5 parts by mass of the curing agent, 21.4 parts by mass of the mixed solvent, 6.5 parts by mass of the thermal conductive spherical filler (F11-3), and 11.5 parts by mass of the boron nitride filler (F2-3).

Example 1

Two laminates with a size of 10 cm×10 cm were cut out from the intermediate laminate 1A'. In these two laminates, the masses of only the sheet 1A' excluding the releasable sheet were 0.876 g and 0.849 g, respectively.

In addition, one laminate with a size of 10 cm×10 cm was cut out from the intermediate laminate 1B'. In this laminate, the mass of only the sheet 1B' excluding the releasable sheet was 1.039 g.

The side opposite to the releasable sheet of one intermediate laminate 1A' and the side opposite to the releasable sheet of the intermediate laminate 1B' were combined and bonded together by a roll laminator.

Next, the releasable sheet on the side of the intermediate laminate 1B' was peeled off, similarly, the side opposite to the releasable sheet of the other intermediate laminate 1A' was bonded to the exposed surface of the sheet 1B', and thereby a laminate in which both surfaces of the thermal conductive insulating sheet 1 were covered with a releasable sheet was obtained.

Here, as lamination conditions, a temperature of upper and lower rollers was 80° C., a lamination pressure was 0.6 MPa, and a speed was 0.5 m/min.

The theoretical density of the thermal conductive insulating sheet 1 was as follows.

$$\begin{aligned}
\text{Theoretical density} &= \\
\text{sum (g) of masses of sheet } A' &\text{ and sheet } B'/\text{sum (cm}^3\text{) of volumes} \\
\text{of the same} &= (\text{mass (g) of sheet } 1A' + \text{mass (g) of sheet } 1B')/ \\
(\text{volume (cm}^3\text{) of sheet } 1A' &+ \text{volume (cm}^3\text{) of sheet } 1B') = \\
(\text{mass (g) of sheet } 1A' &+ \text{mass (g) of sheet } 1B')/[ \\
(\text{mass of sheet } 1A'/&\text{theoretical density of sheet } 1A) + \\
(\text{mass of sheet } 1B/&\text{theoretical density of sheet } 1B)] = \\
((0.876 + 0.849) + 1.039)/&((0.876 + 0.849)/2.50 + 1.039/2.02) = \\
&2.29
\end{aligned}$$

Next, a laminate in which both surfaces of the thermal conductive insulating sheet 1 with a size of 10 cm×10 cm were covered with a releasable sheet was divided into four laminates with a size of 5 cm×5 cm.

Heat pressing was performed at a pressure of 1 MPa and 180° C. for 1 hour while a releasable sheet was attached to one laminate among the divided laminates, and the releasable sheets on both surfaces were then peeled off. Film thicknesses at four corners and the center were measured using DIGIMICROSTANDMS-5C (commercially available from Nikon) and an average value thereof was 138 μm. In this laminate, the mass of only the thermal conductive insulating sheet 1 excluding the releasable sheets on both surfaces was 0.688 g.

The measured density of the thermal conductive insulating sheet 1 after heat pressing was as follows.

$$\begin{aligned}
\text{Measured density} &= \\
\text{thermal conductive insulating sheet mass (g)}&/\text{thermal} \\
\text{conductive insulating sheet volume (cm}^3\text{)} &= \\
\text{mass (g/cm}^2\text{) per unit area of thermal conductive} \\
\text{insulating sheet 1 after heat pressing}&/\text{thickness} \\
(\text{cm}) \text{ of thermal conductive insulating sheet 1 after} \\
\text{heat pressing} &= [0.688/(5 \times 5)]/(138/10000) = 1.99
\end{aligned}$$

The porosity of the thermal conductive insulating sheet 1 after heat pressing was as follows.

$$\begin{aligned}
\text{Porosity} &= 1 - (\text{measured density}/\text{theoretical density}) \\
&= 1 - 1.99/2.29 = 0.13
\end{aligned}$$

<Thermal Conductivity>

A 15 mm square sheet was cut out from the thermal conductive insulating sheet 1 after heat pressing, gold was vapor-deposited on the surface, and carbon was applied by carbon spray. A thermal diffusivity of the obtained sample at 25° C. was measured using a xenon flash analyzer LFA447NanoFlash (commercially available from NETZ- SCH). The specific heat capacity was measured using a high sensitivity type differential scanning calorimeter DSC220C (commercially available from SII NanoTechnology). For the density, a calculated value from the composition was used. The thermal conductivity was obtained from these parameters.

The thermal conductivity of the thermal conductive insulating sheet 1 after heat pressing was 5.1 W/m·K.

<Breakdown Voltage>

One releasable sheet was peeled off from each of the remaining three laminates and superimposed on an aluminum plate, and subjected to heat pressing at a pressure of 1 MPa at 180° C. for 1 hour, and the other releasable sheet was then peeled off and left overnight at 25° C. and 50% RH. Then, under the same environment, a breakdown voltage was measured using a TM650 breakdown voltage tester (commercially available from Tsuruga Electric Corporation). An average value of breakdown voltage of the three samples was 9.5 kV.

Characteristics of the sheets used for lamination and evaluation results of the obtained thermal conductive insulating sheets (the theoretical density of the thermal conductive insulating sheet before pressing, the measured density after pressing, the porosity, the thermal conductivity, and the breakdown voltage) are shown in Table 2-1 and Table 2-2.

Example 2

Three laminates with a size of 10 cm×10 cm were cut out from the intermediate laminate 1A' and two laminates with a size of 10 cm×10 cm were cut out from the intermediate laminate 1B'. Using these laminates, in the same manner as in Example 1, a laminate in which both surfaces of the 5-layer structure thermal conductive insulating sheet 2 having a lamination structure of releasable sheet/sheet A'/sheet B'/sheet A'/sheet B'/sheet A'/releasable sheet were covered with a releasable sheet was obtained and evaluated. The theoretical density of the thermal conductive insulating sheet 2 was 2.31, and the measured density after pressing was 1.96.

Characteristics of the sheets used for lamination and evaluation results of the obtained thermal conductive insulating sheets are shown in Table 2-1 and Table 2-2.

Examples 3 to 8, and 10

Laminates in which both surfaces of a 3-layer structure thermal conductive insulating sheet were covered with a releasable sheet were obtained in the same manner as in Example 1 except that intermediate laminates 3A' to 7A', 10A' and 11A', and intermediate laminates 3B' to 8B', 10B' and 11B' were used in place of the intermediate laminate 1A' and the intermediate laminate 1B' and evaluated. Characteristics of the sheets used for lamination and evaluation results of the obtained thermal conductive insulating sheets are shown in Table 2-1 and Table 2-2.

Comparative Example 1

A comparative intermediate laminate R1A' in which one surface of a comparative sheet R1A' was covered with a releasable sheet was obtained in the same manner as in the sheet 1A' except that the composition of the coating solution included 6.5 parts by mass of the solution of the resin 1 obtained in the resin synthesis example 1, 2 parts by mass of the curing agent, 15.1 parts by mass of the mixed solvent, and 26.4 parts by mass of the thermal conductive spherical filler (F1-1).

Two laminates with a size of 10 cm×10 cm were cut out from the comparative intermediate laminate R1A' and the sides opposite to the releasable sheets of these laminates were combined and bonded together by a roll laminator under the same conditions as in Example 1, and thereby a laminate in which both surfaces of the thermal conductive insulating sheet were covered with a releasable sheet was obtained and evaluated. Characteristics of the sheets used for lamination and evaluation results of the obtained thermal conductive insulating sheets are shown in Table 3-1 and Table 3-2.

Comparative Example 2

A comparative sheet R2A' and a comparative intermediate laminate R2A' were obtained in the same manner as in Comparative Example 1 except that the composition of the coating solution included 9.2 parts by mass of the solution of the resin 1 obtained in the resin synthesis example 1, 2.9 parts by mass of the curing agent, 13.1 parts by mass of the mixed solvent, 15.6 parts by mass of the thermal conductive spherical filler (F1-1), and 9.3 parts by mass of the boron nitride filler (F2-1), and evaluated. Characteristics of the sheets used for lamination and evaluation results of the obtained thermal conductive insulating sheets are shown in Table 3-1 and Table 3-2.

Comparative Example 3

A comparative sheet R3B' and a comparative intermediate laminate R3B' were obtained in the same manner as in Comparative Example 1 except that the composition of the coating solution included 15.8 parts by mass of the solution of the resin 1 obtained in the resin synthesis example 1, 4.9 parts by mass of the curing agent, 15.6 parts by mass of the mixed solvent, and 13.7 parts by mass of the boron nitride filler (F2-1) and similarly evaluated. Characteristics of the sheets used for lamination and evaluation results of the obtained thermal conductive insulating sheets are shown in Table 3-1 and Table 3-2.

Comparative Example 4

A comparative sheet R4B' and a comparative intermediate laminate R4B' were obtained in the same manner as in Comparative Example 1 except that the composition of the coating solution included 12.1 parts by mass of the solution of the resin 1 obtained in the resin synthesis example 1, 3.8 parts by mass of the curing agent, 18.3 parts by mass of the mixed solvent, and 15.8 parts by mass of the boron nitride filler (F2-1), and similarly evaluated. Characteristics of the sheets used for lamination and evaluation results of the obtained thermal conductive insulating sheets are shown in Table 3-1 and Table 3-2.

Comparative Example 5

A comparative sheet R5B' and a comparative intermediate laminate R5B' were obtained in the same manner as in Comparative Example 1 except that the composition of the coating solution included 8.9 parts by mass of the solution of the resin 1 obtained in the resin synthesis example 1, 2.8 parts by mass of the curing agent, 20.8 parts by mass of the mixed solvent, and 17.6 parts by mass of the boron nitride filler (F2-1) were obtained and similarly evaluated. Characteristics of the sheets used for lamination and evaluation results of the obtained thermal conductive insulating sheets are shown in Table 3-1 and Table 3-2.

Comparative Example 6

A coating solution was obtained using the solution of the resin 1 obtained in the resin synthesis example 1 in an amount of 35.9 parts by mass, the curing agent in an amount of 11.3 parts by mass, and the mixed solvent in an amount of 2.8 parts by mass and without using the thermal conductive spherical filler (F1) and the boron nitride filler (F2). A comparative intermediate laminate R6A' in which one surface of the comparative sheet R6A' was covered with a releasable sheet was obtained in the same manner as in the sheet 1A' except that the obtained coating solution was applied to the releasable sheet using a 1 MIL blade coater.

In addition, a comparative sheet R6B' and a comparative intermediate laminate R6B' were obtained in the same manner as in Comparative Example 1 except that the composition of the coating solution included 4.4 parts by mass of the solution 1 of the resin obtained in the resin synthesis example 1, 1.4 parts by mass of the curing agent, 24.1 parts by mass of the mixed solvent, 6.8 parts by mass of spherical alumina (Alunabeads CB-P02 commercially available from Showa Denko, hereinafter referred to as a "thermal conductive spherical filler (F1-5)") having an average particle size of 2 μm, 2.3 parts by mass of spherical alumina (ADMA-FINE AO-502 commercially available from Admatechs, hereinafter referred to as a "thermal conductive spherical filler (F1-6)") having an average particle size of 0.7 μm, and 11 parts by mass of the granulated boron nitride filler (F2) (PTX-25 commercially available from Momentive, hereinafter referred to as a "boron nitride filler (F2-5)") having an average particle size of 25 μm.

The releasable sheet of the comparative intermediate laminate R6B' was removed and the comparative intermediate laminate R6A' was bonded to both surfaces, and thereby a comparative intermediate laminate R6 was obtained, and evaluated in the same manner as in Comparative Example 1. Characteristics of the sheets used for lamination and evaluation results of the obtained thermal conductive insulating sheets are shown in Table 3-1 and Table 3-2.

Comparative Example 7

A comparative intermediate laminate R7A' in which one surface of a comparative sheet R6A' was covered with a releasable sheet was obtained in the same manner as in the comparative sheet R6A' except that the composition of the coating solution included 17.2 parts by mass of the solution of the resin 1 obtained in the resin synthesis example 1, 5.4 parts by mass of the curing agent, 7 parts by mass of the mixed solvent, and 20.4 parts by mass of the thermal conductive spherical filler (F1-6).

The releasable sheet of the comparative intermediate laminate R6B' was removed, and the comparative intermediate laminate R7A' was bonded to both surfaces, and thereby a comparative intermediate laminate R7 was obtained and evaluated in the same manner as in Comparative Example 1. Characteristics of the sheets used for lamination and evaluation results of the obtained thermal conductive insulating sheets are shown in Table 3-1 and Table 3-2.

Comparative Example 9

A laminate in which both surfaces of a 3-layer structure thermal conductive insulating sheet were covered with a releasable sheet was obtained in the same manner as in Example 1 except that the intermediate laminate 9A' and the intermediate laminate 9B' were used in place of the intermediate laminate 1A' and the intermediate laminate 1B' and evaluated. Characteristics of the sheets used for lamination and evaluation results of the obtained thermal conductive insulating sheets are shown in Table 3-1 and Table 3-2.

TABLE 1

Thermal conductive spherical filler (F1)

| | Product name | Manufacturer | Average particle size (μm) | Circularity |
|---|---|---|---|---|
| F1-1 | AO-509 | Admatechs | 10 | 0.99 |
| F1-2 | H grade | Tokuyama Corporation | 1 | 0.98 |
| F1-3 | CB-A20S | Showa Denko | 21 | 0.98 |
| F1-4 | DAW-45 | Denka Company Limited | 41 | 0.98 |
| F1-5 | CB-P02 | Showa Denko | 2 | 0.98 |
| F1-6 | AO-502 | Admatechs | 0.7 | 0.98 |

Boron nitride filler (F2)

| | Product name | Manufacturer | Average particle size * (μm) | Type |
|---|---|---|---|---|
| F2-1 | Agglomerates100 | 3M Japan | 65 to 85 | Granulated |
| F2-2 | PTX-60 | Momentive Performance Materials Inc. | 55 to 65 | Granulated |
| F2-3 | Platelets009 | 3M Japan | 8 to 11 | Scaly |
| F2-4 | Platelets015 | 3M Japan | 13 to 16 | Scaly |
| F2-5 | PTX-25 | Momentive Performance Materials Inc. | 25 | Granulated |

Average particle size *: Manufacturer document value

TABLE 2-1

| Examples | Sheet A' | | | | | | Sheet B' | | | | | |
|---|---|---|---|---|---|---|---|---|---|---|---|---|
| | | Filler (F1) | | Filler (F2) | | Filler vol % | | Filler (F1) | | Filler (F2) | Average compressive force mN | %* |
| | Resin | Type | %* | Type | %* | | Resin | Type | %* | Type | | |
| 1 | 1A' | 1 | 1 | 70 | 1.0 | 14 | 60 | 1B' | 1 | 1 | 29 | 1 | 1.3 | 51 |
| 2 | | | | | | | | | | | | | | |
| 3 | 3A' | 2 | 1 | 70 | 1.0 | 14 | 60 | 3B' | 2 | 1 | 29 | 1 | 1.3 | 51 |
| 4 | 4A' | 1 | 2 | 70 | 1.0 | 14 | 63 | 4B' | 1 | 2 | 29 | 1 | 1.3 | 51 |

TABLE 2-1-continued

| Examples | Sheet A' Resin | Filler (F1) Type | %* | Filler (F2) Type | %* | Filler vol % | Sheet B' Resin | Filler (F1) Type | %* | Filler (F2) Type | Average compressive force mN | %* |
|---|---|---|---|---|---|---|---|---|---|---|---|---|
| 5 | 5A' | 1 | 88 | — | 0 | 65 | 5B' | — | 0 | 1 | 1.3 | 74 |
| 6 | 6A' | 3 | 55 | 1.0 | 22 | 51 | 6B' | 3 | 29 | 1 | 1.3 | 51 |
| 7 | 7A' | 1 | 70 | 2.0 | 14 | 60 | 7B' | 1 | 22 | 2 | 3.6 | 46 |
| 8 | 1A' | 1 | 70 | 1.0 | 14 | 60 | 8B' | 1 | 27 | 4 | — | 59 |
| 10 | 10A' | 4 | 70 | 2 | 14 | 60 | 10B' | 4 | 29 | 2 | 3.6 | 51 |
| 11 | 11A' | 3 | 70 | 3 | 14 | 60 | 11B' | 3 | 29 | 3 | — | 51 |

%*: mass %
Average compressive force*: Average compressive force required for a compression deformation ratio of 10%

TABLE 2-2

| Examples | Density Theoretical density before pressing | Density Actually measured density after pressing | Porosity Before pressing | Porosity After pressing | Thermal conductivity W/m · K | Breakdown voltage kV |
|---|---|---|---|---|---|---|
| 1 | 2.29 | 1.99 | 0.18 | 0.13 | 5.1 | 9.5 |
| 2 | 2.31 | 1.96 | 0.20 | 0.15 | 4.9 | 10~ |
| 3 | 2.26 | 1.96 | 0.18 | 0.13 | 5.1 | 9.5 |
| 4 | 2.13 | 1.85 | 0.19 | 0.13 | 6.0 | 9.5 |
| 5 | 2.14 | 1.84 | 0.17 | 0.14 | 4.7 | 8.2 |
| 6 | 1.99 | 1.69 | 0.17 | 0.15 | 4.9 | 7.5 |
| 7 | 2.00 | 1.80 | 0.14 | 0.10 | 4.5 | 9.1 |
| 8 | 2.19 | 1.80 | 0.25 | 0.18 | 3.8 | 7.0 |
| 10 | 2.23 | 1.88 | 0.20 | 0.16 | 9.5 | 9.5 |
| 11 | 2.20 | 1.98 | 0.14 | 0.10 | 3.9 | 6.0 |

TABLE 3-1

| Comparative examples | Sheet A' Resin | Filler (F1) Type | %* | Filler (F2) Type | %* | Filler vol % | Sheet B' Resin | Filler (F1) Type | %* | Filler (F2) Type | Average compressive force mN | %* |
|---|---|---|---|---|---|---|---|---|---|---|---|---|
| 1 | R1A' | 1 | 88 | — | 0 | 65 | | | | | | |
| 2 | R1A' | 1 | 52 | 1 | 31 | 61 | | | | | | |
| 3 | | | | | | | R3B' | 1 | — | 0 | 1.0 | 1.3 | 61 |
| 4 | | | | | | | R4B' | 1 | — | 0 | 1.0 | 1.3 | 70 |
| 5 | | | | | | | R5B' | 1 | — | 0 | 1.0 | 1.3 | 78 |
| 6 | R6A' | 1 | — | 0 | — | 0 | 0 | R6B' | 1 | 5 / 6 | 30 / 10 | 5 | 3.8 | 49 |
| 7 | R7A' | 1 | 6 | 68 | — | 0 | 35 | R6B' | 1 | 5 / 6 | 30 / 10 | 5 | 3.8 | 49 |
| 9 | 9A' | 1 | 1 | 70 | 1 | 20 | 73 | 9B' | 1 | 1 | 26 | 1 | 1.3 | 23 |

%*: mass %
Average compressive force*: Average compressive force required for a compression deformation ratio of 10%

TABLE 3-2

| Comparative examples | Density | | Porosity | | Thermal conductivity W/m · K | Breakdown voltage kV |
|---|---|---|---|---|---|---|
| | Theoretical density before pressing | Actually measured density after pressing | Before pressing | After pressing | | |
| 1 | 2.56 | 2.25 | 0.19 | 0.12 | 1.2 | 8.5 |
| 2 | 2.14 | 1.65 | 0.30 | 0.23 | 4.4 | 3.1 |
| 3 | 1.52 | 1.25 | 0.25 | 0.18 | 2.4 | 5.2 |
| 4 | 1.65 | 1.22 | 0.32 | 0.26 | 4.2 | 2.1 |
| 5 | 1.78 | 1.14 | 0.40 | 0.36 | 6.1 | 1.1 |
| 6 | 2.10 | 1.43 | 0.40 | 0.32 | 3.5 | 4.5 |
| 7 | 2.32 | 1.34 | 0.48 | 0.42 | 4.0 | 1.2 |
| 9 | 2.05 | 1.76 | 0.21 | 0.14 | 3.0 | 8.5 |

[Industrial Applicability]

The thermal conductive insulating sheet of the present invention can be suitably used for thermal control applications of electronic members.

Priority is claimed on Japanese Patent Application No. 2016-045514, filed Mar. 9, 2016, and Japanese Patent Application No. 2016-230822, filed Nov. 29, 2016, the content of which is incorporated herein by reference.

The invention claimed is:

1. A thermal conductive insulating sheet including a thermal conductive spherical filler (F1) excluding boron nitride, a powdery or granular boron nitride filler (F2), and a binder resin,
wherein the thermal conductive insulating sheet satisfies the following conditions (1) to (6):
(1) the thermal conductive insulating sheet has a porosity of 0.2 or less;
(2) the thermal conductive insulating sheet includes a plurality of layers (A) that contain a thermal conductive spherical filler (F1) and optionally contain a boron nitride filler (F2) and one or more layers (B) that contain the boron nitride filler (F2) and optionally contain the thermal conductive spherical filler (F1);
(3) the plurality of layers (A) and the one or more layers (B) are alternately laminated such that the layer (B) is not positioned on an outermost layer;
(4) a mass of the thermal conductive spherical filler (F1) that is contained in the outermost layer ($A_{out}$) among the plurality of layers (A) is larger than a mass of the thermal conductive spherical filler (F1) that is optionally contained in the layer (B);
(5) a combined occupied volume ratio of the thermal conductive spherical filler (F1) and the boron nitride filler (F2) in the outermost layer ($A_{out}$) is more than 50% with respect to a total volume of 100% of the thermal conductive spherical filler (F1), the boron nitride filler (F2), and the binder resin in the outermost layer ($A_{out}$); and
(6) the layer (B) includes 30 to 90 mass % of the boron nitride filler (F2) with respect to a total of 100 mass % of the thermal conductive spherical filler (F1), the boron nitride filler (F2), and the binder resin.

2. The thermal conductive insulating sheet according to claim 1,
wherein the thermal conductive spherical filler (F1) is selected from the group consisting of alumina and aluminum nitride.

3. The thermal conductive insulating sheet according to claim 1,
wherein the boron nitride filler (F2) is selected from the group consisting of scaly primary particles and granules obtained by granulating scaly primary particles.

4. The thermal conductive insulating sheet according to claim 1,
wherein a combined occupied volume ratio of the thermal conductive spherical filler (F1) and the boron nitride filler (F2) in the outermost layer ($A_{out}$) is more than 50% and 90% or less.

5. The thermal conductive insulating sheet according to claim 1,
wherein the boron nitride filler (F2) includes an easily deformable aggregate of boron nitride that has an average particle size of 2 to 100 μm and an average compressive force of 5 mN or less required for a compression deformation ratio of 10% and that is obtained by granulating boron nitride particles having an average primary particle diameter of 0.1 to 15 μm.

6. A method of producing a thermal conductive insulating sheet including a thermal conductive spherical filler (F1) excluding boron nitride, a powdery or granular boron nitride filler (F2), and a binder resin and having a porosity of 0.2 or less,
wherein, in the method of producing a thermal conductive insulating sheet, the plurality of following sheets (A') and the following sheet of one or more layers (B') are alternately laminated such that the sheet (B') does not become an outermost layer and pressurized;
wherein the sheet (A') includes 30 to 90 mass % of the thermal conductive spherical filler (F1) and 0 to 30 mass % of the boron nitride filler (F2) with respect to a total of 100 mass % of the thermal conductive spherical filler (F1), the boron nitride filler (F2), and the binder resin, and a combined occupied volume ratio of the thermal conductive spherical filler (F1) and the boron nitride filler (F2) is more than 50% with respect to a total volume of 100% of the thermal conductive spherical filler (F1), the boron nitride filler (F2), and the binder resin,
wherein the sheet (B') includes 30 to 90 mass % of the boron nitride filler (F2) and 0 to 30 mass % of the thermal conductive spherical filler (F1) with respect to a total of 100 mass % of the thermal conductive spherical filler (F1), the boron nitride filler (F2), and the binder resin, and
wherein an amount of the thermal conductive spherical filler (F1) contained in the sheet (A') is larger than an amount of the thermal conductive spherical filler (F1) contained in the sheet (B').

7. The method of producing a thermal conductive insulating sheet according to claim 6,
wherein the thermal conductive spherical filler (F1) is selected from the group consisting of alumina and aluminum nitride.

8. The method of producing a thermal conductive insulating sheet according to claim 6,
wherein the boron nitride filler (F2) is selected from the group consisting of scaly primary particles and granules obtained by granulating scaly primary particles.

9. The method of producing a thermal conductive insulating sheet according to claim 6,
wherein a combined occupied volume ratio of the thermal conductive spherical filler (F1) and the boron nitride filler (F2) is more than 50% and 90% or less with respect to a total volume of 100% of the thermal conductive spherical filler (F1), the boron nitride filler (F2), and the binder resin in the sheet (A').

10. A thermal conductive insulating sheet including a thermal conductive spherical filler (F1), a powdery or granular boron nitride filler (F2), and a binder resin and having a porosity of 0.2 or less,
wherein, in the thermal conductive insulating sheet, the following plurality of sheets (A') and the following sheet of one or more layers (B') are alternately laminated so that the sheet (B') does not become an outermost layer and pressurized,
wherein the sheet (A') includes 30 to 90 mass % of the thermal conductive spherical filler (F1) and 0 to 30 mass % of the boron nitride filler (F2) with respect to a total of 100 mass % of the thermal conductive spherical filler (F1), the boron nitride filler (F2), and the binder resin, and a combined occupied volume ratio of the thermal conductive spherical filler (F1) and the boron nitride filler (F2) is more than 50% with respect to a total volume of 100% of the thermal conductive spherical filler (F1), the boron nitride filler (F2), and the binder resin,
wherein the sheet (B') includes 30 to 90 mass % of the boron nitride filler (F2) and 0 to 30 mass % of the thermal conductive spherical filler (F1) with respect to a total of 100 mass % of the thermal conductive spherical filler (F1), the boron nitride filler (F2), and the binder resin, and
wherein an amount of the thermal conductive spherical filler (F1) contained in the sheet (A') is larger than an amount of the thermal conductive spherical filler (F1) contained in the sheet (B').

11. The thermal conductive insulating sheet according to claim 10,
wherein the boron nitride filler (F2) is selected from the group consisting of scaly primary particles and granules obtained by granulating scaly primary particles.

12. An intermediate laminate for producing a thermal conductive insulating sheet including a thermal conductive spherical filler (F1), a powdery or granular boron nitride filler (F2) and a binder resin and having a porosity of 0.3 or less,
wherein, in the intermediate laminate for producing a thermal conductive insulating sheet, the following plurality of sheets (A') and the following sheet of one or more layers (B') are alternately laminated so that the sheet (B') does not become an outermost layer,
wherein the sheet (A') includes 30 to 90 mass % of the thermal conductive spherical filler (F1) and 0 to 30 mass % of the boron nitride filler (F2) with respect to a total of 100 mass % of the thermal conductive spherical filler (F1), the boron nitride filler (F2), and the binder resin, and a combined occupied volume ratio of the thermal conductive spherical filler (F1) and the boron nitride filler (F2) is more than 50% with respect to a total volume of 100% of the thermal conductive spherical filler (F1), the boron nitride filler (F2), and the binder resin,
wherein the sheet (B') includes 30 to 90 mass % of the boron nitride filler (F2) and 0 to 30 mass % of the thermal conductive spherical filler (F1) with respect to a total of 100 mass % of the thermal conductive spherical filler (F1), the boron nitride filler (F2), and the binder resin, and
wherein an amount of the thermal conductive spherical filler (F1) contained in the sheet (A') is larger than an amount of the thermal conductive spherical filler (F1) contained in the sheet (B').

* * * * *